United States Patent [19]

Hall

[11] Patent Number: 5,528,081
[45] Date of Patent: Jun. 18, 1996

[54] HIGH TEMPERATURE REFRACTORY METAL CONTACT IN SILICON INTEGRATED CIRCUITS

[76] Inventor: John H. Hall, 3169 Payne Ave., San Jose, Calif. 95117

[21] Appl. No.: 375,048

[22] Filed: Jan. 18, 1995

Related U.S. Application Data

[63] Continuation of Ser. No. 82,629, Jun. 25, 1993, abandoned.

[51] Int. Cl.$^6$ ............................ H01L 23/48; H01L 29/40
[52] U.S. Cl. .................... 257/768; 257/750; 257/751; 257/763; 257/767; 257/770; 257/382; 257/383; 257/384
[58] Field of Search ................................. 257/763, 764, 257/765, 767, 768, 750, 751, 761, 770, 382–384

[56] References Cited

U.S. PATENT DOCUMENTS

| | | | |
|---|---|---|---|
| 3,701,931 | 10/1972 | Revitz et al. | 257/761 |
| 4,042,953 | 8/1977 | Hall | 257/768 |
| 4,782,380 | 11/1988 | Shankar et al. | 257/764 |
| 4,910,580 | 3/1990 | Kuecher et al. | 257/764 |
| 4,926,237 | 5/1990 | Sun et al. | 257/750 |
| 5,049,975 | 9/1991 | Ajika et al. | 257/764 |
| 5,136,362 | 8/1992 | Grief et al. | 257/767 |
| 5,202,579 | 4/1993 | Fujii et al. | 257/763 |

FOREIGN PATENT DOCUMENTS

| | | |
|---|---|---|
| 1-220824 | 9/1989 | Japan . |
| 2-170424 | 7/1990 | Japan . |
| 4-014874 | 1/1992 | Japan . |
| 4-027163 | 1/1992 | Japan ................. 257/764 |

*Primary Examiner*—Steven H. Loke
*Assistant Examiner*—Teresa Maria Arroyo
*Attorney, Agent, or Firm*—Townsend and Townsend and Crew

[57] ABSTRACT

A contact and interconnect structure for a semiconductor integrated circuit includes a thin layer of refractory metal on a contact surface of the substrate through an opening in an overlying insulation layer with boron ions implanted into the substrate through the layer of refractory metal and the contact surface to ensure a uniform ohmic contact. An interconnect structure is then formed on the insulation layer and on the thin layer of refractory metal including a first layer of a refractory metal nitride on the insulation layer, a second layer of refractory metal on the first layer of refractory metal nitride, and a second layer of refractory metal nitride on the second layer of refractory metal.

2 Claims, 1 Drawing Sheet ns. 5,528,081

HIGH TEMPERATURE REFRACTORY METAL CONTACT IN SILICON INTEGRATED CIRCUITS

This is a Continuation of application Ser. No. 08/082,629, filed Jun. 25, 1993, now abandoned.

BACKGROUND OF THE INVENTION

This invention relates generally to integrated circuits fabricated in silicon substrates, and more particularly, the invention relates to electrical interconnections and contacts in such integrated circuits.

It is well known that a multilayer integrated circuit interconnection structure is desirable to improve circuit performance as well as to increase circuit density. Prior art structures include etched contact holes formed in an oxide coated wafer surface, a layer of aluminum formed on the oxide surface and in the contact holes to form contact with selected regions of the wafer. The aluminum layer is patterned to interconnect specific portions of the integrated circuit. This contact and interconnection structure has not been especially satisfactory for many applications because the highly reactive aluminum pits the silicon and silicon oxide during high temperature processing reducing the structure's breakdown voltage. Subsequent processing steps such as passivation and multilayer interconnection increases the reaction between the aluminum and the silicon oxide. Elevated temperature required for some processing steps, on the order of 900° C., further promotes aluminum and oxide reaction. The aluminum may recrystallize in formations which crack the insulating layer separating multiple metal layers. Thus, the use of aluminum contacts and interconnections severely restricts subsequent processing steps at elevated temperatures.

U.S. Pat. No. 4,042,953 issued to John H. Hall, applicant herein, for HIGH TEMPERATURE REFRACTORY METAL CONTACT ASSEMBLY AND MULTIPLE LAYER INTERCONNECT STRUCTURE discloses an ohmic contact and interconnect structure including a layer of refractory metal such as molybdenum between two layers of silicon. The bottom silicon layer provides an adherent interface with an underlying insulating layer such as silicon oxide or to contact surfaces of the substrate, while the top silicon layer is provided so that ohmic contact can be easily made to the refractory metal. While the multilayer structure is relatively inert and withstands subsequent high temperature processing, the contact structure can develop a high resistance after being exposed to higher temperatures. This is due to the fact that silicon in the contact holes is purified by reaction with the molybdenum to raise its resistance. There is also a problem with residual silicon dioxide on the surface of the silicon substrate in the contacting areas which causes erratic contact resistance.

The present invention is directed to an integrated circuit having improved high temperature contacts and interconnect structures which overcome problems associated with prior art structures.

SUMMARY OF THE INVENTION

In accordance with the invention, a multilayer refractory metal and refractory metal nitride interconnect and contact structure is provided. The refractory metal nitride structure is electrically conductive and has the same work function as the refractory metal thereby facilitating high temperature processing. The resulting structure can withstand processing temperatures in excess of 1000° C., which will be encountered in next generation semiconductor device fabrication.

In forming circuit contacts to surfaces of the silicon substrate, a thin layer of the refractory metal and a second refractor metal nitride layer is first deposited on the substrate surface in contact holes through an overlying insulating layer. Reaction of the refractory metal layer with silicon is minimized by limiting the thickness of the refractory metal in the sandwich structure. Boron ions are then implanted into the substrate through the refractory metal layer. The ion implantation drives the refractory metal atoms through any silicon oxide on the contact surface and into the substrate, thereby allowing a consistent ohmic contact to be formed.

The invention and objects and features thereof will be more readily apparent from the following detailed description and appended claims when taken with the drawing.

DETAILED DESCRIPTION OF ILLUSTRATIVE EMBODIMENT

Figure 1:
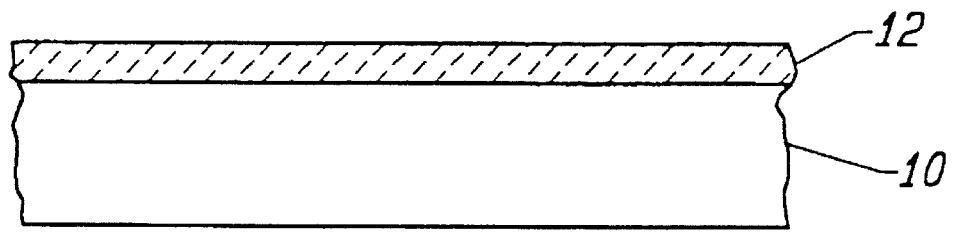
FIGS. 1–4 are section views of a portion a silicon substrate illustrating steps in fabricating a refractory metal contact and interconnect structure in accordance with the invention.
Figure 2:
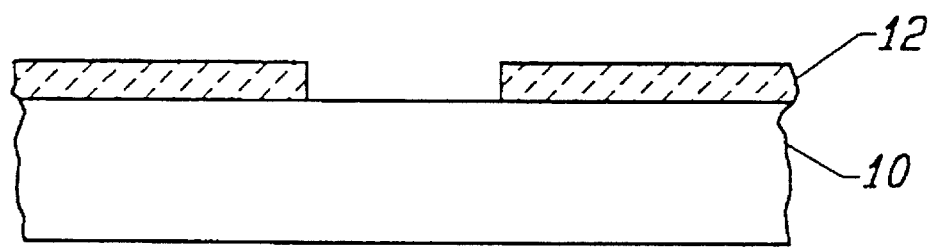

Referring now to the drawing, FIG. 1 is a section view of a portion of a silicon substrate 10 in which an integrated circuit is formed and an overlying insulation layer 12 of silicon oxide. The layer 12 is formed on the surface of the silicon substrate 10 by thermal oxidation of the surface in a steam atmosphere at 1000° C. Thereafter, as illustrated in FIG. 2, the silicon oxide insulation layer 12 is selectively masked and etched to form a contact opening therethrough and exposing a contact surface on substrate 10.

Figure 3:
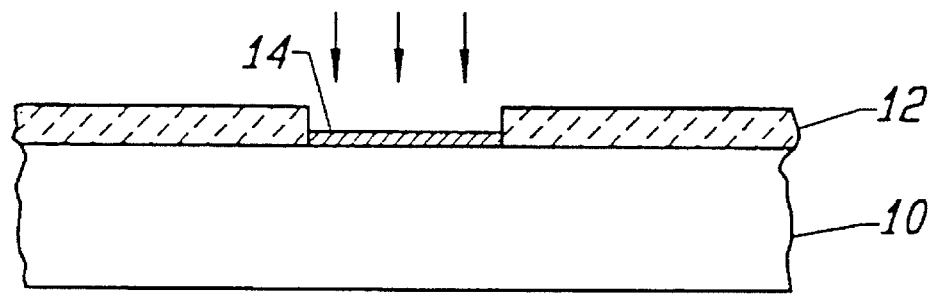

In FIG. 3, a thin layer 14 of a refractory metal, molybdenum, for example, is deposited by sputtering on the contact surface of substrate 10 through the contact opening in the silicon oxide layer 12, and then a boron implant of approximately 1E15 at 60 kv is made through the layer of molybdenum into the underlying substrate, thereby driving the refractory metal atoms through any residual silicon oxide formed on the surface of the substrate, and allowing a consistent ohmic contact to be formed. Boron is selected for this implant since it enhances contact to P type material and does not interfere with the contact to high concentration N type material, which is usually found in source, drain, or emitter diffusions in integrated circuits. To limit reaction of the refractory metal and the substrate, the thickness of the layer 14 is limited to approximately 200 Å, and a second layer of metal nitride of 300 Å is formed to act as a passivating layer.

Figure 4:
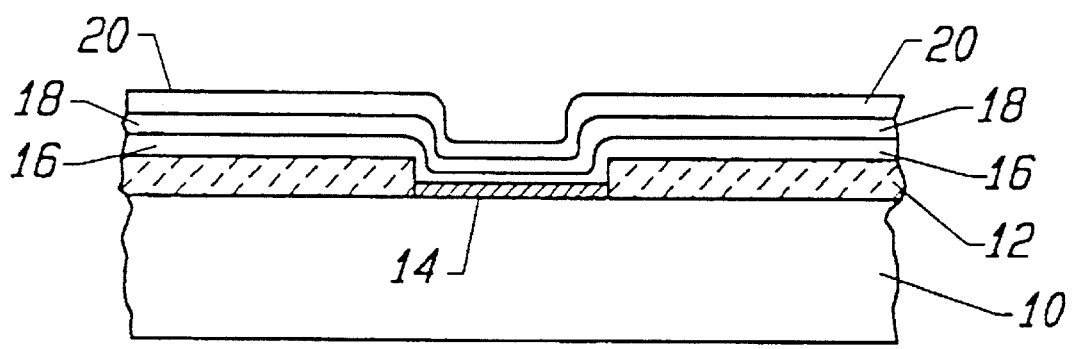

After formation of the refractory metal layer and ion implantation, a multilayer contact and interconnect structure is formed on the surface of the integrated circuit over the insulation layer 12 and on the molybdenum layer 14. As illustrated in FIG. 4, the multilayer structure includes a molybdenum nitride layer 16, a layer 18 of molybdenum, and a top layer 20 of molybdenum nitride.

As described in copending application 14982-6, the multilayer interconnect structure is formed by placing substrate 10 in a vacuum sputtering apparatus along with a target of molybdenum. The first layer 16 of molybdenum nitride is formed by sputtering the refractory metal in a plasma atmosphere including nitrogen. Thereafter, the nitrogen gas is purged from the atmosphere, and the refractory metal is sputtered in an inert argon plasma to form the layer 18 of pure molybdenum. Thereafter, nitrogen is again introduced into the atmosphere and the second layer 20 of molybdenum nitride is deposited on the surface of the refractory metal, thereby completing formation of the multilayer structure. The structure can then be selectively etched to define a desired interconnect pattern.

While the illustrative embodiment is described with molybdenum refractory metal, other refractory metals such as tungsten, and tantalum can be employed in practicing the invention. Further the metal and metal nitrides can be deposited by chemical vapor deposition. The implanted ions can be gallium or indium as well as boron. Thus, while the invention has been described with reference to a specific embodiment, the description is illustrative of the invention and is not to construed as limiting the invention. Various modifications and applications may occur to those skilled in the art without departing from the true spirit and scope of the invention as defined by the appended claims.

What is claimed is:

1. A high temperature contact and interconnect structure for semiconductor integrated circuit processing temperatures on the order of 900° C., comprising a supporting semiconductor substrate, an insulation layer on a surface of said supporting substrate, a contact opening through said insulation layer over a contact surface on said substrate, a first layer of refractory metal on said contact surface, implanted boron ions in said substrate through said first layer of refractory metal and refractory metal atoms driven into said substrate to facilitate ohmic contact between said interconnect structure and said substrate, a first layer of a refractory metal nitride on said insulation layer and on said first layer of refractory metal, a second layer of refractory metal on said first layer of refractory metal nitride, a second layer of refractory metal nitride on said second layer of refractory metal, said first layer of refractory metal nitride, said second layer of refractory metal, and said second layer of refractory metal nitride forming said interconnect structure, and said refractory metals being selected from the group consisting of molybdenum, tungsten, and tantalum.

2. A contact and interconnect structure as defined by claim 1, wherein said first layer of refractory metal is approximately 200 Å in thickness.

\* \* \* \* \*